United States Patent
Degenkolb et al.

(10) Patent No.: US 6,535,396 B1
(45) Date of Patent: Mar. 18, 2003

(54) COMBINATION CIRCUIT BOARD AND SEGMENTED CONDUCTIVE BUS SUBSTRATE

(75) Inventors: Thomas Alan Degenkolb, Noblesville, IN (US); Darrel Eugene Peugh, Kokomo, IN (US); Bruce Alan Myers, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/560,981

(22) Filed: Apr. 28, 2000

(51) Int. Cl.⁷ ................................. H01R 9/00
(52) U.S. Cl. ............... 361/775; 361/748; 361/675; 361/760; 174/258; 174/260; 174/255
(58) Field of Search ................ 361/685, 760, 361/705, 709, 775, 719, 720, 748, 761, 764, 803, 675; 174/258, 260, 255, 88 B, 70 B

(56) References Cited

U.S. PATENT DOCUMENTS

| | | | |
|---|---|---|---|
| 4,150,421 A | * 4/1979 | Nishihara et al. | 361/410 |
| 4,410,927 A | * 10/1983 | Butt | 361/386 |
| 4,498,122 A | * 2/1985 | Rainal | 361/414 |
| 4,560,962 A | * 12/1985 | Barrow | 333/1 |
| 4,628,411 A | * 12/1986 | Balderes et al. | 361/414 |
| 5,973,396 A | * 10/1999 | Farnworth | 257/698 |

* cited by examiner

Primary Examiner—David Martin
Assistant Examiner—Hung Bui
(74) Attorney, Agent, or Firm—Jimmy L. Funke

(57) ABSTRACT

A combination circuit board (12) and segmented bus structure (54) defines a composite circuit board/bus assembly (52) upon which an electrical circuit may be assembled. The various segments (54a–54f) of bus structure (54) may be variously configured to achieve one or more assembly, performance, testing, and/or reliability goals. For example, one bus segment configuration provides integral connector tabs (54a and 54e) for mechanical and/or electrical connection to interconnecting wires or electrical terminals of one or more external devices. Another bus segment configuration (54d) provides for mechanical and high current electrical interconnections between one or more bus segments (54a–54f) and one or more electrical components (16, 18, 20) and/or conductive film patterns(64) formed on top surface (12b) of the circuit board (12). Still another bus segment configuration provides integral tabs (54b and 54c) for electrical connection to and mechanical attachment of electrical components (16, 18, 20) from one or more of such tabs (54b and 54c) extending through the circuit board (12) to other such tabs (54b and 54c) or other circuit structures. Yet another bus structure (54f) provides for highly efficient heat sinking capability and/or electrical connection for electrical components (18) mounted either directly to one or more bus segments (54f) and for electrical components (18) mounted to a substrate (68) that is itself mounted directly to one or more bus segments (54f).

13 Claims, 5 Drawing Sheets

COMBINATION CIRCUIT BOARD AND SEGMENTED CONDUCTIVE BUS SUBSTRATE

TECHNICAL FIELD

The present invention relates generally to electrical and electronic circuit structures, and more specifically to techniques for assembling electrical and electronic circuitry.

BACKGROUND OF THE INVENTION

Printed circuit boards are known and have been widely used in the assembly of electrical and electronic circuitry. Such circuit boards typically provide mechanical support for a number of electrical and electronic components while also defining various electrically conductive circuit paths thereon. Additionally, some modern printed circuit board technologies include the lamination of metallic back plates for further mechanical support, thermal management of the various electrical components attached thereto and/or to provide for electrical net connections.

An example of one known modern printed circuit board arrangement 5 is illustrated in FIG. 1 and includes a circuit board 10 having a metallic film 14, such as copper (Cu) for example, affixed to at least one side thereof to define a printed circuit board 12. In FIG. 1, the metallic film 14 is shown as being affixed to a back side of circuit board 10, although additional films 14 may be affixed to the top side of circuit board 10 and/or within circuit board 10 and interconnected in a predefined manner as is known in the art. In any case, the printed circuit board arrangement 5 is conventionally assembled by attaching electrical components 16, 18 and 20 to printed circuit board 12 and electrically interconnecting such components via known means prior to attaching the assembled circuit board 12 and 16–20 to a metallic back plate 22 via a thermally conductive yet electrically insulating adhesive 24. The metallic back plate 22 is typically a copper or aluminum plate that provides support and rigidity to circuit board assembly 12 and 16–20 while also acting as a heat sink for dissipating heat generated by one or more of the electrical components 16, 18 and 20.

An example of another known modern printed circuit board arrangement 30 is illustrated in FIG. 2 and includes a printed circuit board 12 having a number of electrical components 16, 18 and 20 attached thereto via known means to thereby provide a circuit board assembly 12 and 16–20. A support assembly 32 is formed by affixing a number of segmented metallic bus structures to a rigid metallic plate 22 via a thermally conductive yet electrically insulating adhesive 24. Three such bus structures 34a, 34b and 34c (collectively defining a composite bus structure 34) are shown in FIG. 2, and are typically formed of copper (Cu) or Aluminum (Al) as is plate 22. The circuit board assembly 12 and 16–20 is then affixed to the support assembly 32 via an electrically conductive adhesive 36. The circuit board arrangement 30 is thought to be superior to circuit board arrangement 5 of FIG. 1 because the bus structure 34 provides for more direct heat sinking capability of individual electrical components as well as an added means for electrically interconnecting circuit paths defined by circuit board assembly 12 and 16–20.

While the foregoing printed circuit board arrangements are widely used in the automotive and other industries, they have certain drawbacks associated therewith. For example, while both arrangements provide at least some heat sinking capability, neither arrangement provides for efficient thermal dissipation with respect to individual ones of the electrical components 16, 18 and 20. As another example, arrangement 30 does not provide for electrical and mechanical connection of any of the circuit components 16, 18 and 20 to any of the various bus structures 34a–34c, nor does it provide for electrical and/or mechanical connection to any of the bus structures 34a–34c external to circuit arrangement 30. Finally, arrangement 30 requires pre-assembly of the electrical components 16, 18 and 20 to circuit board 12 prior to attachment of the bus structure 34 thereto. Such an arrangement thus allows electrical interconnection only between the various bus structures 34a–34c and an electrically conductive film, such as film 14, patterned on the backside of circuit board 12.

What is therefore needed is an improved printed circuit board arrangement utilizing a segmented bus structure that provides for greater overall thermal dissipation capability, increased heat sinking efficiency with respect to individual electrical components mounted to the circuit board, allows for high current interconnections to the bus structure and electrical and/or mechanical connection to the bus structure of one or more of the electrical circuit components as well as circuitry external to the circuit board.

SUMMARY OF THE INVENTION

The foregoing shortcomings of the prior art are addressed by the present invention. In accordance with one aspect of the present invention, a method of forming an electrical circuit comprises the steps of attaching a conductive bus structure defining a number of bus segments to at least a first surface of a circuit board, at least one of the bus segments extending through the circuit board from the first surface to at least an opposite second surface, and mounting a first electrical component to either of an opposite surface of the circuit board and the at least one of the bus segments extending through the circuit board from at least the first surface to at least the second surface.

In accordance with another aspect of the present invention, a method of forming an electrical circuit comprises the steps of attaching a conductive bus structure defining a number of bus segments to at least a first surface of a circuit board, a first surface of at least one of the bus segments defining a terminal end of a passageway extending into a second opposite surface of the circuit board, mounting an electrical component to the at least a first surface of one of the bus segments defining the terminal end of the passageway, and electrically connecting the electrical component to at least one circuit node defined on the second opposite surface of the circuit board.

In accordance with yet another aspect of the present invention, a method of forming an electrical circuit comprises the steps of attaching a conductive bus structure defining a number of bus segments to at least a first surface of a circuit board, at least one of the bus segments extending through the circuit board from the first surface to at least an opposite second surface, and electrically connecting the at least one of the bus segments extending through the circuit board from the first surface to at least an opposite second surface to a circuit node defined on the opposite second surface of the circuit board.

In accordance with still another aspect of the present invention, an electrical circuit comprises a circuit board defining a first surface and a second opposite surface, a bus structure defining a number of bus segments, the bus structure mounted to at least the first surface of the circuit board with at least one of the number of bus segments extending through the circuit board from the first surface to the second opposite surface, and an electrical circuit defined on the second opposite surface of the circuit board, the at least one of the number of bus segments extending through the circuit board from the first surface to the second opposite surface connected to a circuit node forming part of the electrical circuit.

In accordance with a further aspect of the present invention, an electrical circuit comprises a circuit board defining a first surface and a second opposite surface, a bus structure defining a number of bus segments, the bus structure defining a first surface mounted to at least the first surface of the circuit board with at least a portion of the first surface of at least one of the number of bus segments defining a terminal end of a passageway extending into the second opposite surface of the circuit board, and an electrical component mounted to the at least a portion of the first surface of at least one of the number of bus segments defining a terminal end of a passageway extending into the second opposite surface of the circuit board, the electrical component electrically connected to a circuit node forming part of an electrical circuit defined on the second opposite surface of the circuit board.

One object of the present invention is to provide a combined circuit board and segmented conductive bus assembly that overcomes drawbacks associated with prior art structures. These and other objects of the present invention will become more apparent from the following description of the preferred embodiment.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 3:
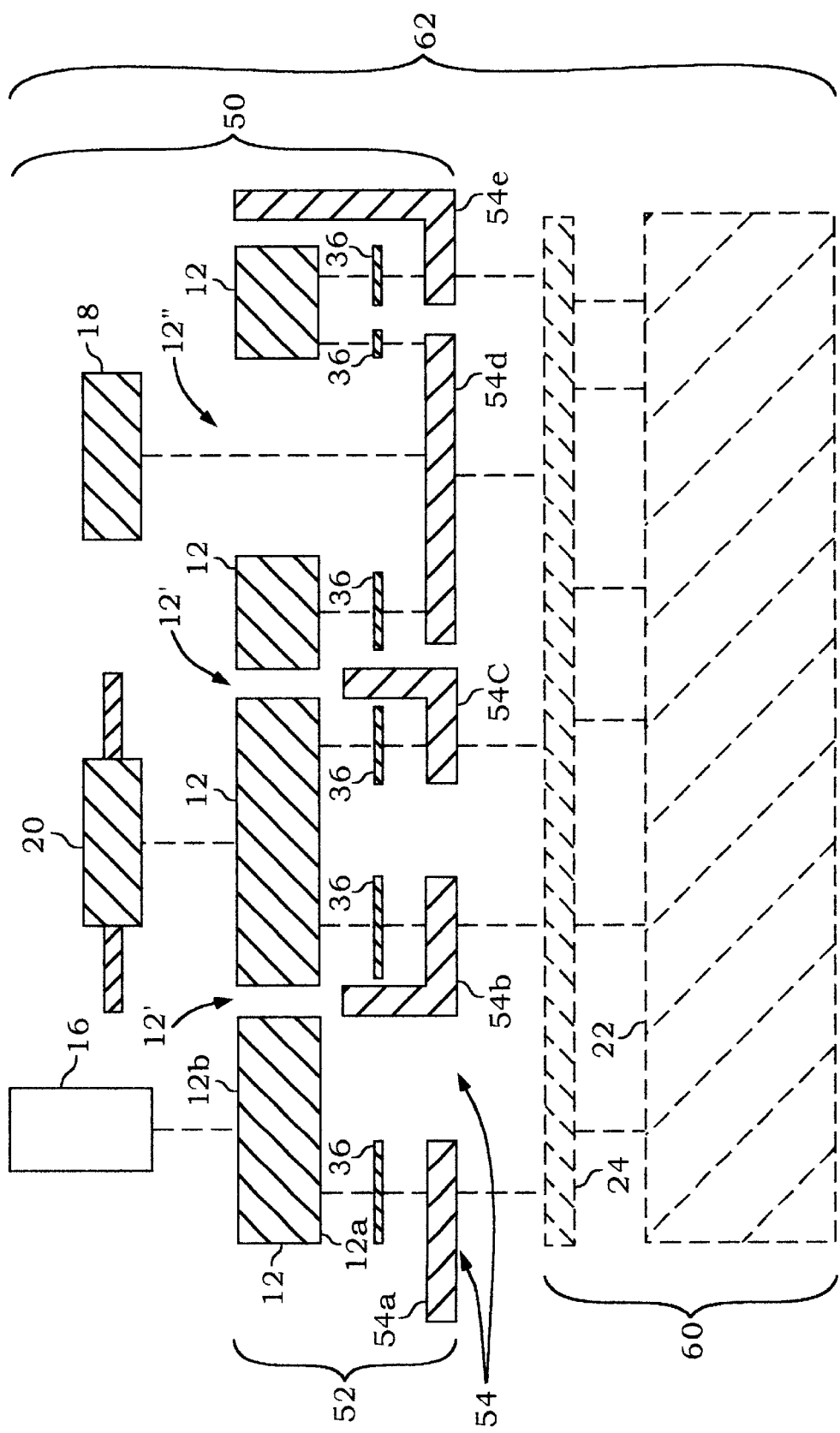
FIG. 3 is an exploded cross-sectional view illustrating some of the concepts of the present invention relating to assembly of an electrical circuit.

The circuit board and segmented bus arrangement of the present invention overcomes the drawbacks associated with prior art circuit board arrangements while providing for additional flexibility in circuit assembly techniques. Referring to FIG. 3, an exploded and cross-sectional view of one preferred embodiment of an electrical circuit arrangement 62 utilizing a circuit board and segmented bus, is shown. A circuit board 12 is provided and is preferably a printed circuit board defining a conductive pattern on at least a bottom side 12a or a top side 12b thereof as well as a number of holes or perforations therethrough from the top side 12b to the bottom side 12a (not shown in FIG. 3) as is known in the art. It is contemplated that at least some of the holes or perforations may be plated through in the sense that conductive paths are defined through such holes or perforations from one surface of the circuit board 12 to the other. It is to be understood, however, that circuit board 12 need not include any conductive patterns thereon or therein, nor are any holes or perforations required therethrough. In any case, and in addition to any holes or perforations that may be defined therethrough, circuit board 12 may further define a number of passageways 12' and 12" therethrough, the purposes of which will be more fully described hereinafter. In one embodiment, circuit board 12 is formed from a laminated fiberglass-type material or from plastic as is known in the art, although the present invention contemplates that circuit board 12 may alternatively be formed from other known dielectric materials and/or from other known electrically conductive materials.

A segmented bus structure, shown generally by designators 54a–54e, is provided wherein each segment may be formed in a desired shape to provide a specified function. For example, bus segment 54a is configured to extend outwardly from one end of circuit board 12 to provide for external connection thereto, and bus segment 54e is configured to extend outwardly from an opposite end of circuit board 12 and upwardly toward circuit board 12. As another example, bus segments 54b and 54c are configured to contact a bottom side 12a of circuit board 12 and also to extend through passageways 12' with a portion of each segment 54a and 54b extending beyond a top side 12b of circuit board 12. As a further example, bus segment 54d is configured to form an end of passageway 12" adjacent to the bottom side 12a of circuit board 12. Each of the bus segments are formed from an electrically conductive material, wherein such material is preferably copper (Cu), although other electrically conductive materials are contemplated. Additionally, it is to be understood that the segmented bus structure or substrate 54 may be a unitary structure defining bus segments such as segments 54a–54e, or may alternatively comprise a number of individual bus segments such as any one or more of segments 54a–54e. In any case, the various segments 54a–54e are preferably affixed to the bottom side 12a of circuit board 12 via a known adhesive or other bonding material 36 such as solder, for example, to form a circuit board/bus assembly 52, although the present invention contemplates affixing segments 54a–54e to the bottom side of circuit board 12 via any known means including, but not limited to, any known mechanical means or other bonding medium.

A number of electrical components 16, 18 and 20 are provided for mounting to circuit board 12 and/or to any one or more of the bus structures 54a–54e to form a resultant electrical circuit assembly 50. Examples of some of the electrical component mounting techniques contemplated by the present invention will be described hereinafter with respect to FIGS. 5 and 6. In any case, electrical circuit assembly 50 may or may not be mounted to a support or other structure 60, and structure 60 is shown in phantom in FIG. 3 to accordingly indicate that such structure 60 is optional. In embodiments wherein structure 60 is included, structure 60 preferably includes a thermally conductive heat sink 22 or other support structure and an electrically insulating yet thermally conductive bonding medium 24 for affixing heat sink 22 to the various bus segments 54a–54e. In one embodiment, heat sink 22 is preferably formed from copper (Cu) Aluminum (Al), or other known thermally conductive material, and bonding medium 24 is preferably an electrically insulating and thermally conductive adhesive material, although the present invention contemplates alternate materials for heat sink 22 and bonding medium 24.

Figure 4:
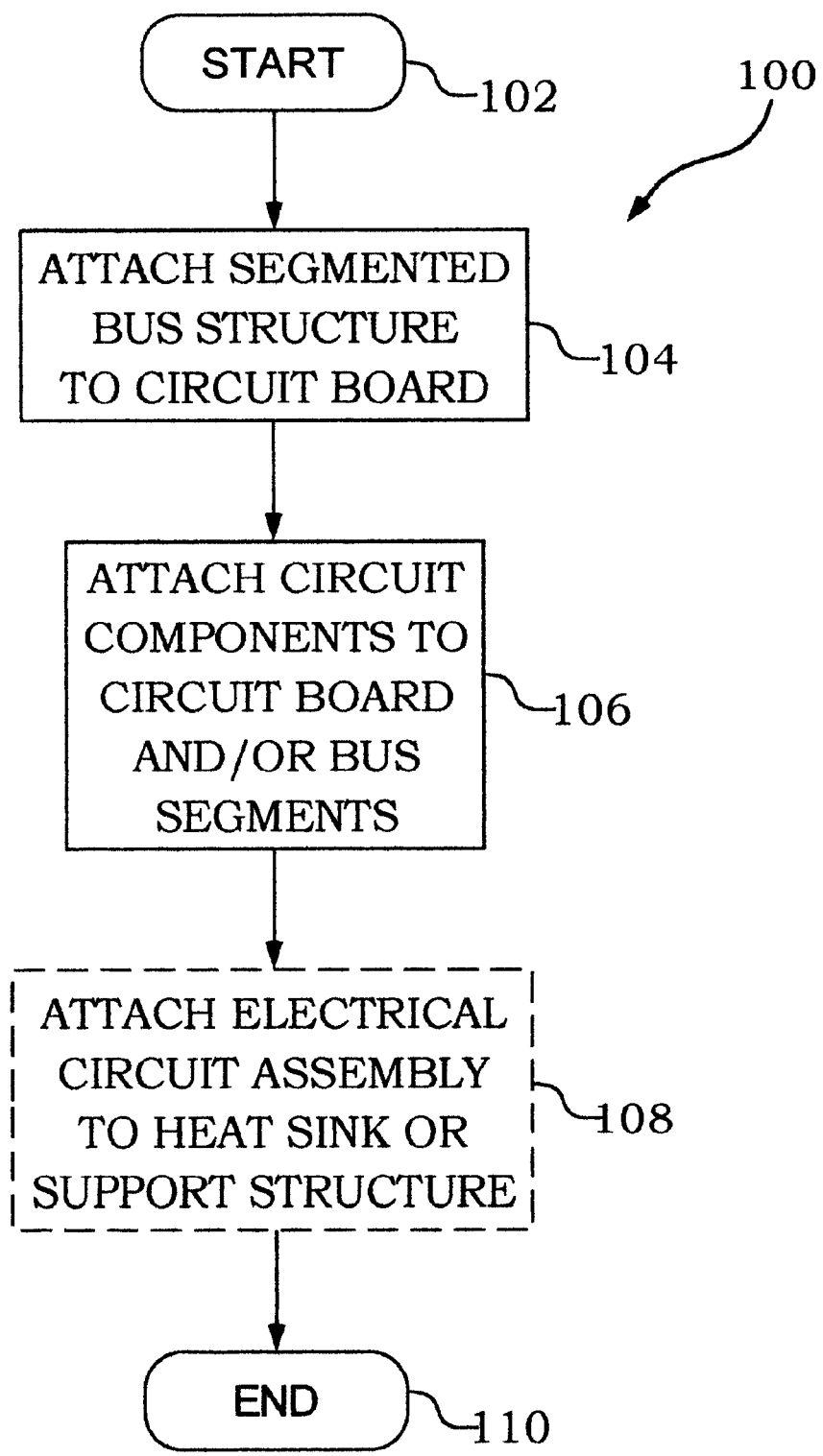
FIG. 4 is a flowchart illustrating one preferred embodiment of an electrical circuit assembly process in accordance with the present invention.

In accordance with one important aspect of the present invention, the electrical circuit arrangement 62 of FIG. 3 enjoys a distinct assembly advantage over other known circuit board-based electrical circuit assemblies. Referring to FIG. 4, for example, one preferred embodiment of an electrical circuit assembly process 100, in accordance with the present invention, is shown. Process 100 begins at step 102 and at step 104, a segmented bus structure, which may include any one or more of the variously configured bus structures 54a–54e as well as other bus structure configurations, is attached to circuit board 12 via bonding medium 36 or other known attachment means to form circuit board/segmented bus assembly 52. Thereafter at step 106, electrical circuit assembly 50 is mechanically and electrically defined by mounting electrical circuit components 16, 18, and/or 20 to circuit board 12 and/or to any of the various bus structures 54a–54e as well as any other bus structure configurations included within circuit board/segmented bus assembly 52. Following step 106, step 108 is shown in phantom in FIG. 4 indicating that step 108 is optional and therefore may or may not be included in process 100 as desired. If included, step 108 is executed by attaching the completed electrical circuit assembly 50 to a heat sink or other support structure 22 via a suitable attachment or bonding medium 24 as previously described. Process 100 ends thereafter at step 110.

Figure 1:
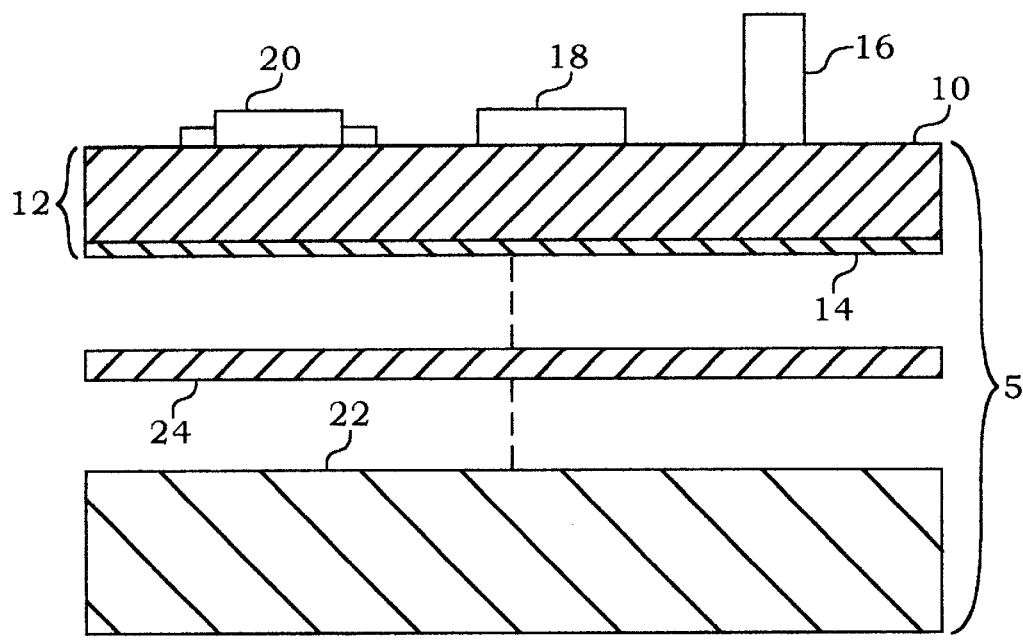
FIG. 1 is an exploded cross-sectional view of a prior art electrical circuit illustrating the assembly thereof.
Figure 2:
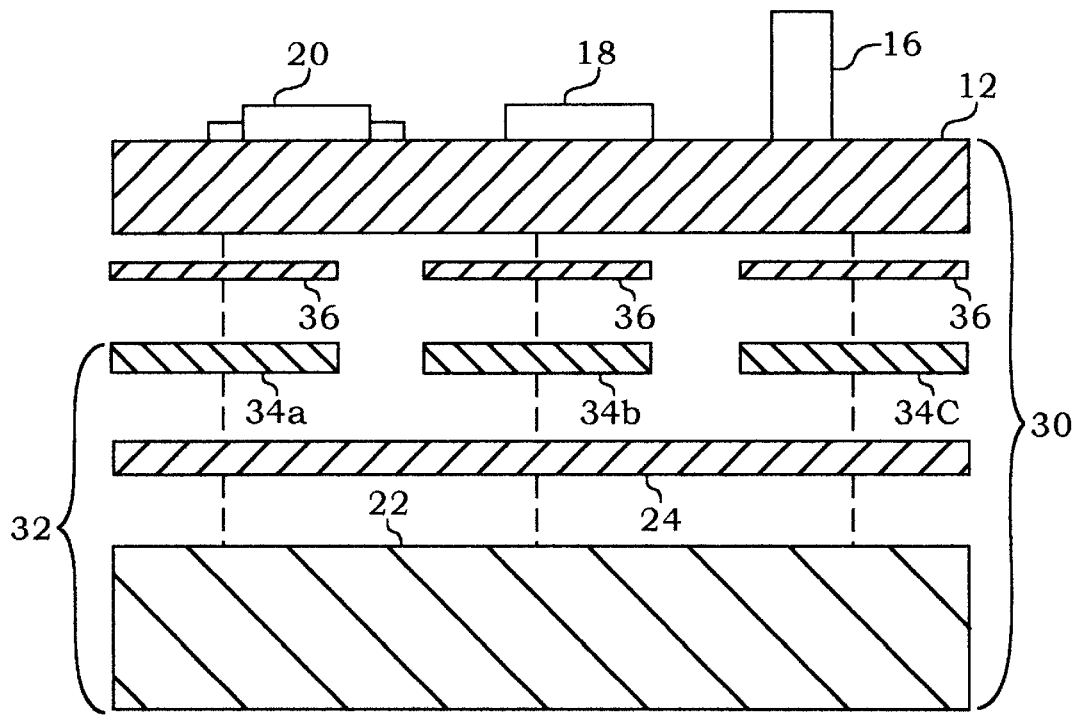
FIG. 2 is an exploded cross-sectional view of another prior art electrical circuit illustrating the assembly thereof.

The foregoing circuit assembly process 100 provides for distinct assembly, performance and testing advantages over known circuit board/segmented bus assemblies such as that shown in FIG. 2 and discussed hereinabove in the BACKGROUND section. For example, because the segmented bus structure 54a–54e is affixed to circuit board 12 prior to mounting and interconnecting electrical components 16, 18 and 20 thereto, at least some of the bus structures 54a–54e may be used in forming the mechanical and/or electrical connections to such electrical components 16, 18 and 20, thereby providing additional flexibility in the electrical circuit assembly process over known techniques. As another example, the assembly process 100 illustrated in FIGS. 3 and 4 provides for the capability to mount power integrated circuits (ICs), as well as other electrical components generating large amounts of heat, directly to one or more of the bus structures 54a–54e to thereby provide for more efficient heat sinking capability than was otherwise possible with prior art circuit assembly techniques. As still another example, the assembly process 100 illustrated in FIGS. 3 and 4 facilitates electrical circuit testing since the completed electrical circuit assembly 50 defines a fully functional electrical circuit and can therefore be functionally tested prior to any further assembly processes such as attachment of a heat sink structure 22 thereto. Moreover, the assembly process 100 provides electrical access to any and all bus structures 54a–54e that were not directly accessible in prior art circuit board/bus structure assemblies. As a further example, the assembly process 100 illustrated in FIGS. 3 and 4 increases the reliability of resultant electrical circuits by providing high current bus segment paths to the electrical circuitry and therefore avoiding potentially unreliable high current paths defined by plated through holes defined through printed circuit boards. Those skilled in the art will recognize other advantages afforded by the assembly process of the present invention, and that such other advantages, whether structural, performance or process related, fall within the scope of the present invention.

Figure 5:
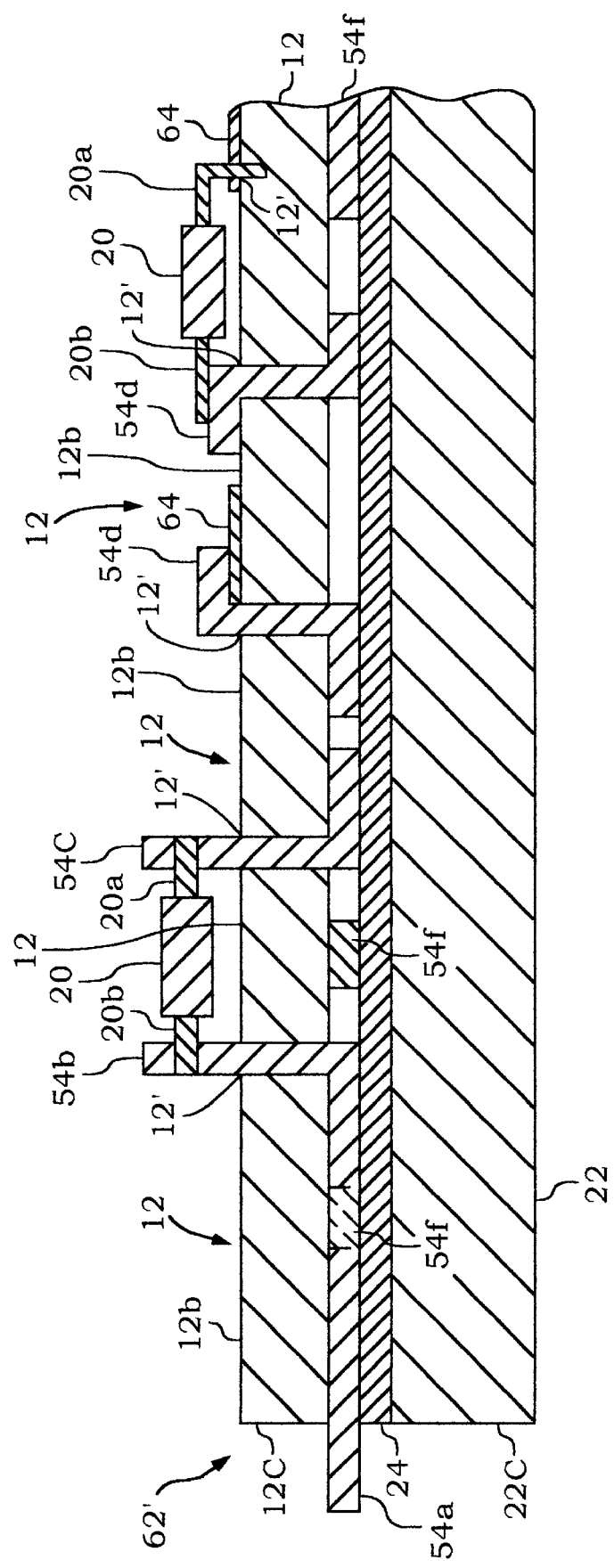
FIG. 5 is a cross-sectional view of a portion of an electrical circuit assembled according to techniques shown in FIGS. 3 and 4 and illustrating a number of resultant circuit structures in accordance with the present invention.
Figure 6:
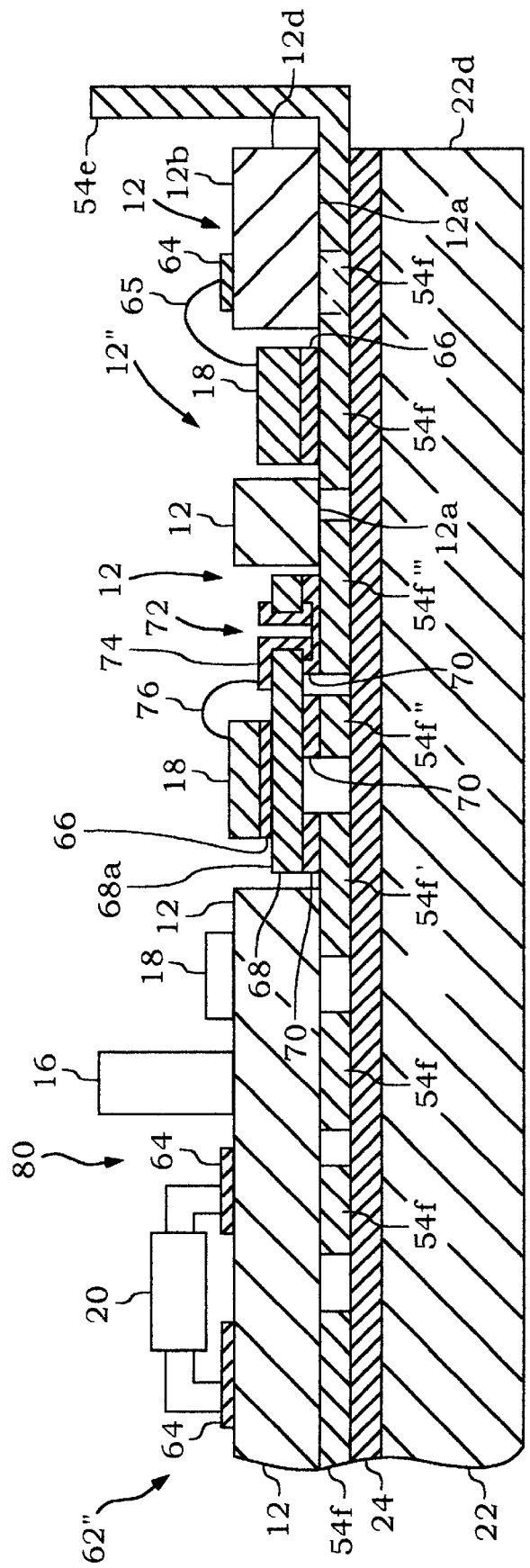
FIG. 6 is a cross-sectional view of another portion of an electrical circuit assembled according to techniques shown in FIGS. 3 and 4 and illustrating a number of additional circuit structures in accordance with the present invention.

Referring now to FIGS. 5 and 6, specific examples of electrical component mounting and/or interconnections will be provided with respect to specific configurations of corresponding bus segments, wherein the bonding medium 36 between the various bus segments 54a–54f and circuit board 12 is omitted from these figures for clarity of illustration. FIG. 5 illustrates a portion 62' of an assembled electrical circuit arrangement 62, and FIG. 6 illustrates another portion 62" of an assembled electrical circuit arrangement 62, wherein like numbers are used to identify like components that are illustrated in FIG. 3. It is to be understood that while FIGS. 5 and 6 each include a heat sink 22, such heat sinks 22 or similar support structures are not required parts of the electrical circuit assemblies shown, as previously described with respect to FIGS. 3 and 4. In any case, referring specifically to FIG. 5, a bus segment 54a is shown mounted between heat sink 22 and circuit board 12 wherein at least a portion of bus segment 54a extends beyond the juxtaposed ends 22c and 12c of the heat sink 22 and circuit board 12 respectively. The protruding portion of bus segment 54a provides a structure capable of electrical and/or mechanical connection to an external device or electrical connector, wherein bus segment 54a may itself define a circuit node of the electrical circuit mounted to circuit board 12 or may alternatively be electrically connected to a desired circuit node of the electrical circuit mounted to circuit board 12 via a general purpose bus segment 54f as shown in phantom in FIG. 5. Referring to FIG. 6, a similar bus segment 54e is shown mounted between heat sink 22 and circuit board 12 wherein at least a portion of bus segment 54e extends beyond the juxtaposed ends 22d and 12d of the heat sink 22 and circuit board 12 respectively and upwardly toward, and optionally beyond the top surface 12b of, circuit board 12. As with bus segment 54a, bus segment 54e provides a structure capable of electrical and/or mechanical connection to an external device or devices, wherein but segment 54e may itself define a circuit node of the electrical circuit mounted to circuit board 12 or may alternatively be electrically connected to a desired circuit node of the electrical circuit mounted to circuit board 12 via a general purpose bus segment 54f as shown in phantom in FIG. 6.

Referring again to FIG. 5, a pair of bus segments 54b and 54c are shown each having a first portion mounted between heat sink 22 and circuit board 12 and each having a second portion extending through separate passageways 12' and protruding beyond the top surface 12b of circuit board 12. The protruding portion of bus segments 54b and 54c each provide structures capable of electrical and/or mechanical connection to one or more electrical components forming part of the electrical circuit 50 (FIG. 3). As shown in FIG. 5, for example, bus structure 54b is mechanically and electrically connected to one terminal 20b of electrical component 20 and bus structure 54c is mechanically and electrically connected to the opposite terminal 20c of component 54c.

With further reference to FIG. 5, a bus segment 54d is shown having a first portion mounted between heat sink 22 and circuit board 12, a second portion extending through passageway 12' and a third portion formed over a portion of the top surface 12b of circuit board 12. The third portion of bus segment 54d is preferably mechanically formed over top surface 12b, such as by appropriately bending or folding over any portion of bus segment 54d extending upwardly from top surface 12b of circuit board 12 after segment 54d is passed through passageway 12'. In any case, the third portion of bus segment 54d provides a structure capable of electrical and/or mechanical connection to one or more electrical components forming part of the electrical circuit 50 (FIG. 3) and/or provides a high current interconnection between a conductive film 64 formed on the top surface 12*b* of circuit board 12 and another conductive structure such as another conductive film 64, an electrical component 16, 18, or 20, or the like. For example, bus segment 54*d* may be formed over a conductive film 64 as shown in FIG. 5, wherein segment 54*d* is preferably attached to film 64 via appropriate means such as solder to thereby define a potentially high current bus path between film 64 and another conductive structure. As another example, bus segment 54*d* may be formed over the top surface 12*b* of circuit board 12, and a conductive terminal 20*b* of an electrical component 20 may be mechanically and electrically connected thereto via appropriate means such as solder. The opposite terminal 20*a* of electrical component 20 is shown extending through a passageway 12' defined through a portion of conductive film 64 and within the top surface 12*b* of circuit board 12. Terminal 20*a* of electrical component 20 is preferably mechanically and electrically connected to conductive film 64 via appropriate means such as solder.

Referring now to FIG. 6, a bus segment 54*f* is shown mounted between heat sink 22 and circuit board 12 and forming a terminal end of passageway 12" adjacent to the bottom surface 12*a* of circuit board 12. Bus segment 54*f* provides a structure capable of electrical and/or mechanical connection to an electrical component forming part of the electrical circuit 50 (FIG. 3). For example, as shown in FIG. 6, an electrical device such as an integrated circuit (IC)18 is mounted directly to bus segment 54*f* via an appropriate attachment medium 66, wherein circuitry on board IC 18 is electrically connected to conductive film 64 formed on the top surface 12*b* of circuit board 12 via wire 65. Besides providing for mechanical attachment of IC 18, bus segment 54*f* may, in this example, serve at least either one or both of two other purposes. In one embodiment, for example, the attachment medium 66 is preferably a thermally conductive yet electrically insulating attachment medium such as a known adhesive material similar to or identical to attachment medium 24, such that a highly thermally conductive path is thereby established between IC 18 and bus segment 54*f*. In embodiments including heat sink 22, a highly thermally conductive path is likewise established between IC 18 and heat sink 22. In either case, heat sinking efficiency relative to IC 18 is accordingly maximized. In an alternate embodiment, the surface of IC 18 facing bus segment 54*f* may define an electrical terminal of IC 18 and the attachment medium 66 in this case is therefore preferably a thermally and electrically conductive attachment medium. In this embodiment, bus segment 54*f* thus acts not only as an efficient heat sink but also as an electrical conductor capable of carrying high currents. In any case, it is to be understood that IC 18 may include a plurality of electrical devices or may include a single electrical device such as, for example, a power transistor or the like. The present invention further contemplates that heat-generating circuits and/or devices other than IC 18 may be attached directly to a bus segment 54*f* via suitable means, wherein examples of such other heat-generating circuits and/or devices include, but are not limited to, discrete resistors, relays, solenoids, and the like.

Again referring to FIG. 6, two bus segments 54*f'* and 54*f'''* are shown mounted between heat sink 22 and circuit board 12 and adjacent to the bottom surface 12*a* of circuit board 12, wherein these two segments form at least a partial terminal end of another passageway 12". The two bus segments 54*f'* and 54*f'''*, as well as a third bus segment 54*f''* positioned therebetween, provide structures capable of electrical and/or mechanical connection to one or more electrical components forming part of the electrical circuit 50 (FIG. 3). For example, as shown in FIG. 6, a substrate 68 is shown mounted directly to the three individual bus segments 54*f'*, 54*f''* and 54*f'''* via an appropriate attachment medium 70. Substrate 68 may be formed of any known circuit substrate material, and in one embodiment substrate 68 is formed of an insulating substrate material such as ceramic or the like. An electrical component such as an IC 18 or other electrical device is attached to a top side 68*a* of substrate 68 via an appropriate attachment medium 66, and circuitry on board IC 18 is electrically connected to a conductive film 74 formed on the top surface 68*a* of substrate 68 via wire 74. As with the attachment of the IC 18 directly to bus segment 54*f* as described hereinabove, bus segments 54*f'*, 54*f''* and 54*f'''* in this example may, in addition providing for mechanical attachment of IC 18, serve at least either one or both of two other purposes. In one embodiment, for example, the attachment mediums 66 and 70 are preferably thermally conductive yet electrically insulating attachment medium such as a known adhesive material similar to or identical to attachment medium 24, such that a highly thermally conductive path is thereby established between IC 18 and the three bus segments 54*f'*, 54*f''* and 54*f'''*. In embodiments including heat sink 22, a highly thermally conductive path is likewise established between IC 18 and heat sink 22. In either case, heat sinking efficiency relative to IC 18 is accordingly maximized. In an alternate embodiment, the electrically conductive pattern 74 defines one or more plated through holes 72 in which case the attachment medium 70 is preferably a thermally and electrically conductive attachment medium so that conductive pattern 74 is thereby electrically connected to one of the bus segments, such as bus segment 54*f'''* as illustrated in FIG. 6. In this example, bus segment 54*f'''* thus acts not only as an efficient heat sink, but also as an electrical conductor capable of carrying high currents. It is to be understood that circuits and/or devices other than IC 18 may be attached to substrate 68 and electrically attached to any of the bus segments 54*f'*, 54*f''* and 54*f'''* in the manner just described, wherein examples of such other circuits and/or devices include, but are not limited to, discrete electrical components, power transistors, and the like.

Referring once more to FIG. 6, a number of bus segments 54*f* are shown supporting a portion of a circuit board 12 having electrical components 16, 18 and 20 mounted thereto in conventional fashion. Bus segments 54*f* in this example are provided to support circuit board 18 and to further allow for electrical connections thereto, typically via plated through holes, as is known in the art.

It should now be apparent from the foregoing that the circuit board/segmented bus assembly of the present invention provides a number of advantages over known circuit board/segmented bus assemblies. As shown by example hereinabove, the circuit board/segmented bus structure of the present invention provides for mechanical and high current electrical interconnections between one or more bus segments (e.g., 54*d*) and one or more electrical components and/or conductive film patterns formed on top of the circuit board. Moreover, the circuit board/segmented bus structure of the present invention provides integral tabs (e.g., 54*b* and 54*c*) for electrical connection to and mechanical attachment of electrical components from one or more of such tabs extending through the circuit board to other such tabs or other circuit structures. Additionally, the circuit board/segmented bus structure of the present invention provides for highly efficient heat sinking capability and/or electrical connection for electrical components mounted either directly to one or more bus segments and for electrical components mounted to a substrate that is itself mounted directly to one or more bus segments. Additionally still, the circuit board/segmented bus structure of the present invention provides integral tabs (e.g., 54*a* and 54*e*) for attachment to interconnection wires or electrical terminals of one or more external devices.

While the invention has been illustrated and described in detail in the foregoing drawings and description, the same is to be considered as illustrative and not restrictive in character, it being understood that only the preferred embodiments have been shown and described and that all changes and modifications that come within the spirit of the invention are desired to be protected.

What is claimed is:

1. A method of forming an electrical circuit comprising the steps of:

attaching an electrically conductive bus structure defining a number of bus segments to at least a first surface of a circuit board, at least one of said bus segments extending through said circuit board from said first surface to at least an opposite second surface, wherein said attaching step includes attaching said conductive bus structure to said first surface of said circuit board with a first surface of at least another one of said bus segments defining a terminal end of a passageway extending into said second surface of said circuit board;

mounting a first electrical component to said at least one of said bus segments adjacent said opposite second surface; and mounting a second electrical component to said first surface of said at least another one of said bus segments and within said passageway in said circuit board.

2. The method of claim 1 further including the step of electrically connecting at least one electrical terminal of said first electrical component to said at least one of said bus segments adjacent said opposite second surface.

3. The method of claim 1 further including the step of forming at least another one of said number of bus segments as a circuit terminal adapted for connection to an external circuit terminal.

4. The method of claim 1 further including the step of mounting said conductive bus structure in thermally conductive contact to a heat sink, whereby said conductive bus structure provides a thermally conductive path from said first and second electrical components to said heat sink.

5. A method of forming an electrical circuit comprising the steps of:

attaching an electrically conductive bus structure defining a number of bus segments to at least a first surface of a circuit board, at least one of said bus segments extending through said circuit board from said first surface to at least an opposite second surface;

mounting a first electrical component to said at least one of said bus segments adjacent said opposite second surface; and mounting said conductive bus structure in thermally conductive contact to a heat sink, whereby said conductive bus structure provides a thermally conductive path from said first electrical component to said heat sink.

6. A method of forming an electrical circuit comprising the steps of:

attaching an electrically conductive bus structure defining a number of bus segments to at least a first surface of a circuit board, a first surface of at least one of said bus segments defining a terminal end of a passageway extending into a second opposite surface of said circuit board;

mounting an electrical component to said first surface of said at least one of said bus segments and within said passageway in said circuit board;

electrically connecting said electrical component to at least one circuit node defined on said second opposite surface of said circuit board; and mounting a heat sink in thermally conductive contact to said conductive bus structure, whereby said conductive bus structure provides a thermally conductive path from said first electrical component to said heat sink.

7. The method of claim 6 wherein said electrical component is an integrated circuit.

8. The method of claim 7 wherein the step of mounting an electrical component to said at least a first surface of one of said bus segments defining said terminal end of said passageway includes electrically connecting said first surface of said one of said bus segments defining said terminal end of said passageway to a mounting surface of said electrical component.

9. The method of claim 6 wherein said electrical component includes:

a substrate defining a first surface and a second opposite surface; and an electrical device mounted to said first surface of said substrate;

and wherein said mounting step includes mounting said second opposite surface of said substrate to said at least a first surface of one of said bus segments defining said terminal end of said passageway.

10. The method of claim 9 wherein the step of mounting an electrical component to said at least a first surface of one of said bus segments defining said terminal end of said passageway includes electrically connecting said first surface of said one of said bus segments defining said terminal end of said passageway to said electrical device.

11. The method of claim 6 further including the step of forming at least another one of said number of bus segments as a circuit terminal adapted for connection to an external circuit terminal.

12. A method of forming an electrical circuit comprising the steps of:

attaching a unitary electrically conductive bus structure defining a plurality of bus segments to at least a first surface of a circuit board, at least one of said bus segments extending through said circuit board from said first surface to at least an opposite second surface; and electrically connecting said at least one of said bus segments to a circuit node defined on said opposite second surface of said circuit board.

13. The method of claim 12 further including mounting a heat sink in thermally conductive contact to said conductive bus structure, whereby said conductive bus structure provides a thermally conductive path from said circuit node to said heat sink.

* * * * *